(12) United States Patent
Seok et al.

(10) Patent No.: US 9,786,354 B2
(45) Date of Patent: Oct. 10, 2017

(54) MEMORY MODULE

(71) Applicant: SAMSUNG ELECTRONICS CO., LTD., Suwon-si, Gyeonggi-Do (KR)

(72) Inventors: Jong-Hyun Seok, Seoul (KR); Do-Hyung Kim, Hwaseong-si (KR); Won-Hyung Song, Osan-si (KR); Young-Ho Lee, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/269,170

(22) Filed: Sep. 19, 2016

(65) Prior Publication Data

US 2017/0004871 A1    Jan. 5, 2017

Related U.S. Application Data

(63) Continuation-in-part of application No. 14/317,099, filed on Jun. 27, 2014, now Pat. No. 9,449,650.

(60) Provisional application No. 61/844,687, filed on Jul. 10, 2013.

(30) Foreign Application Priority Data

Sep. 26, 2013  (KR) .................. 10-2013-0114689

(51) Int. Cl.
| | |
|---|---|
| *H05K 7/00* | (2006.01) |
| *G11C 11/4093* | (2006.01) |
| *G11C 5/04* | (2006.01) |
| *G11C 7/02* | (2006.01) |
| *G11C 7/10* | (2006.01) |

(52) U.S. Cl.
CPC ............ *G11C 11/4093* (2013.01); *G11C 5/04* (2013.01); *G11C 7/02* (2013.01); *G11C 7/10* (2013.01); *G11C 2207/105* (2013.01)

(58) Field of Classification Search
USPC ................................... 361/760, 679.02, 748
See application file for complete search history.

(56) References Cited

U.S. PATENT DOCUMENTS

| | | | |
|---|---|---|---|
| 4,892,776 A | 1/1990 | Rice | |
| 5,510,594 A | 4/1996 | Mori et al. | |
| 6,891,729 B2 * | 5/2005 | Ko ........................... | G11C 5/04 174/250 |
| 6,930,904 B2 * | 8/2005 | Wu .......................... | G11C 5/00 365/198 |
| 7,284,317 B2 | 10/2007 | Cho et al. | |
| 7,447,038 B2 * | 11/2008 | Uematsu ................. | H01L 23/50 257/691 |

(Continued)

FOREIGN PATENT DOCUMENTS

| | | |
|---|---|---|
| EP | 0569801 | 11/1993 |
| JP | 2005-317766 | * 11/2005 |

(Continued)

*Primary Examiner* — Andargie M Aychillhum
(74) *Attorney, Agent, or Firm* — F. Chau & Associates, LLC

(57) ABSTRACT

A memory module that includes: a printed circuit board having a connecting terminal; memory chips arranged on the printed circuit board; data buffers disposed on a first surface of the printed circuit board and corresponding to the memory chips; and resistance units disposed on a second surface of the printed circuit board and corresponding to the data buffers.

18 Claims, 15 Drawing Sheets

(56) References Cited

U.S. PATENT DOCUMENTS

| | | |
|---|---|---|
| 8,559,235 B2 | 10/2013 | Yoon et al. |
| 2005/0018495 A1* | 1/2005 | Bhakta ..................... G11C 5/04 |
| | | 365/199 |
| 2011/0095783 A1* | 4/2011 | Ferolito .............. G06F 13/4086 |
| | | 326/30 |
| 2011/0096583 A1* | 4/2011 | Seok ........................ G11O 5/06 |
| | | 365/51 |
| 2012/0199973 A1* | 8/2012 | Leddige ................... G11O 5/02 |
| | | 257/738 |
| 2012/0281348 A1* | 11/2012 | Harashima ............... G11O 5/04 |
| | | 361/679.32 |
| 2013/0138898 A1* | 5/2013 | Osanai ................... G06F 12/00 |
| | | 711/154 |
| 2015/0016047 A1 | 1/2015 | Seok et al. |

FOREIGN PATENT DOCUMENTS

| | | | |
|---|---|---|---|
| KR | 1020010038930 | * | 5/2001 |
| KR | 20130138898 A | * | 12/2013 |

* cited by examiner

MEMORY MODULE

CROSS-REFERENCE TO RELATED APPLICATIONS

This application is a continuation in part of application Ser. No. 14/317,099 filed Jun. 27, 2014, which claims priority to U.S. Provisional Patent Application No. 61/844,687, filed on Jul. 10, 2013, in the U.S. Patent and Trademark Office, and Korean Patent Application No. 10-2013-0114689, filed on Sep. 26, 2013, in the Korean Intellectual Property Office, the disclosures of which are incorporated by reference herein in their entireties.

TECHNICAL FIELD

The inventive concept relates to a semiconductor module, such as a memory module employed in a data processing system.

DISCUSSION OF THE RELATED ART

In a data processing system, such as a personal computer (PC), a server computer, a workstation, or a communication system, a memory module may be employed as a data storage memory. In response to a request for high speed processing of multimedia data, the data processing system employs a high data rate operation. As a data rate increases, performance of a memory module may be decreased due to crosstalk, signal distortion, or noise.

SUMMARY

An exemplary embodiment of the inventive concept provides a memory module including a resistance unit and a data buffer.

According to an exemplary embodiment of the inventive concept, there is provided a memory module including: a printed circuit board having a connecting terminal; first memory chips arranged on the printed circuit board; data buffers disposed on a first surface of the printed circuit board and corresponding to the first memory chips; and resistance units disposed on a second surface of the printed circuit board and corresponding to the data buffers.

The memory module may further include a signal line connected to the connecting terminal, the resistance unit and the data buffer that correspond to the one of the first memory chips, and an electric connection pad of the one first memory chip.

The signal line may include: a first wiring connected between a data tab pin of the connecting terminal of the printed circuit board, and the resistance unit; a second wiring connected between the resistance unit and the data buffer through the printed circuit board; and a third wiring connected between the data buffer and the electric connection pad of the first memory chip.

The third wiring may be formed on an internal layer of the printed circuit board.

The memory module may further include a register disposed on the same side of the printed circuit board where the first memory chips are arranged, wherein the register may buffer and provide a signal received through the connecting terminal to the first memory chips.

The data buffers may be disposed adjacent to the connecting terminal on the first surface of the printed circuit board, and the resistance units may be disposed adjacent to the connecting terminal on the second surface of the printed circuit board.

The memory module may further include second memory chips corresponding to the first memory chips, wherein the second memory chips are arranged on a surface of the printed circuit board opposite to where the first memory chips are arranged, wherein the first memory chips and the second memory chips may be connected to each other through a via of the printed circuit board.

The first memory chips may be arranged in two rows on the first surface of the printed circuit board, and the second memory chips may be arranged in two rows on the second surface of the printed circuit board.

The data buffers may be arranged between the two rows of the first memory chips on the first surface of the printed circuit board, and the resistance units may be arranged between the two rows of the second memory chips on the second surface of the printed circuit board.

The data buffers may be arranged between the two rows of the first memory chips on the first surface of the printed circuit board, and the resistance units may be arranged adjacent to the connecting terminal on the second surface of the printed circuit board.

The data buffers may be arranged adjacent to the connecting terminal on the first surface of the printed circuit board, and the resistance units may be arranged between the two rows of the second memory chips on the second surface of the printed circuit board.

The first surface of the printed circuit board may be opposite to the second surface of the printed circuit board.

According to an exemplary embodiment of the inventive concept, there is provided a memory module including: a printed circuit board having a connecting terminal; at least one memory chip arranged on the printed circuit board; a data buffer disposed on a first surface of the printed circuit board and having an output terminal connected to the at least one memory chip; and a resistance unit disposed adjacent to the connecting terminal on a second surface of the printed circuit board, wherein the resistance unit has a first terminal connected to the connecting terminal, and a second terminal connected to an input terminal of the data buffer through a first via in the printed circuit board, wherein the input terminal of the data buffer is disposed adjacent to the at least one memory chip, and the output terminal of the data buffer is disposed adjacent to the connecting terminal.

The data buffer may be connected to the at least one memory chip through a signal line formed on an internal layer of the printed circuit board through a second via. A data input/output signal may be transmitted through the signal line.

The first surface of the printed circuit board may be opposite to the second surface of the printed circuit board.

According to an exemplary embodiment of the inventive concept there is provided a memory module including: at least one memory chip disposed on a first side of a printed circuit board; at least one memory chip disposed on a second side of the printed circuit board; at least one data buffer disposed on the first side of the printed circuit board; and at least one resistance unit disposed on the second side of the printed circuit board.

The first and second sides of the printed circuit board may be opposite to each other.

The memory module may further include a signal line electrically connecting the at least one data buffer, the at least one resistance unit and the at least one memory chip disposed on the first or second side of the printed circuit board to each other.

An output terminal of the at least one data buffer may be disposed adjacent to a connector on the first side of the printed circuit board and an output terminal of the data buffer may be disposed adjacent to the at least one memory chip on the first side of the printed circuit board.

According to an exemplary embodiment of the inventive concept there is provided a memory module including a printed circuit board having a first surface and a second surface, the second surface being opposite surface of the first surface, a data tab pin formed on both surfaces of the printed circuit board for connecting the memory module with an external signal bus, a first memory chip disposed on the first surface of the printed circuit board, a second memory chip disposed on the second surface of the printed circuit board, a data buffer disposed on the first surface of the printed circuit board, the data buffer including an input terminal and an output terminal, and the output terminal being connected to the first memory chip and the second memory chip respectively, a resistance unit disposed on the first surface of the printed circuit board, the resistance unit having a first end and a second end for being connected to the data tab pin and the input terminal of the data buffer respectively, a first wiring directly connecting the data tab pin and a first end of the resistance unit, a second wiring penetrating the printed circuit board and directly connecting the second end of the resistance unit to the input terminal of the data buffer, and a third wiring directly connecting the output terminal of the data buffer to the first memory chip and the second memory chip, wherein at least a portion of the resistance unit is disposed under the data buffer.

According to an exemplary embodiment of the inventive concept there is provided memory module including a printed circuit board having a first surface and a second surface, the second surface being opposite surface of the first surface, a data tab pin formed on both surfaces of the printed circuit board for connecting the memory module with an external signal bus, a first memory chip disposed on the first surface of the printed circuit board, a second memory chip disposed on the second surface of the printed circuit board, a data buffer disposed on the first surface of the printed circuit board, the data buffer including an input terminal and an output terminal, and the output terminal being connected to the first memory chip and the second memory chip respectively, a resistance unit embedded in the printed circuit board, the resistance unit having a first end and a second end for being connected to the data tab pin and the input terminal of the data buffer through contact holes formed on the printed circuit board respectively, a first wiring directly connecting the data tab pin and a first end of the resistance unit, a second wiring penetrating the printed circuit board and directly connecting the second end of the resistance unit to the input terminal of the data buffer, and a third wiring directly connecting the output terminal of the data buffer to the first memory chip and the second memory chip, wherein the resistance unit is disposed between the first surface of the printed circuit board and the second surface of the printed circuit board.

BRIEF DESCRIPTION OF THE DRAWINGS

The above and other features of the inventive concept will become more apparent by describing in detail exemplary embodiments thereof with reference to the accompanying drawings in which.

DETAILED DESCRIPTION OF THE EMBODIMENTS

Figure 1:
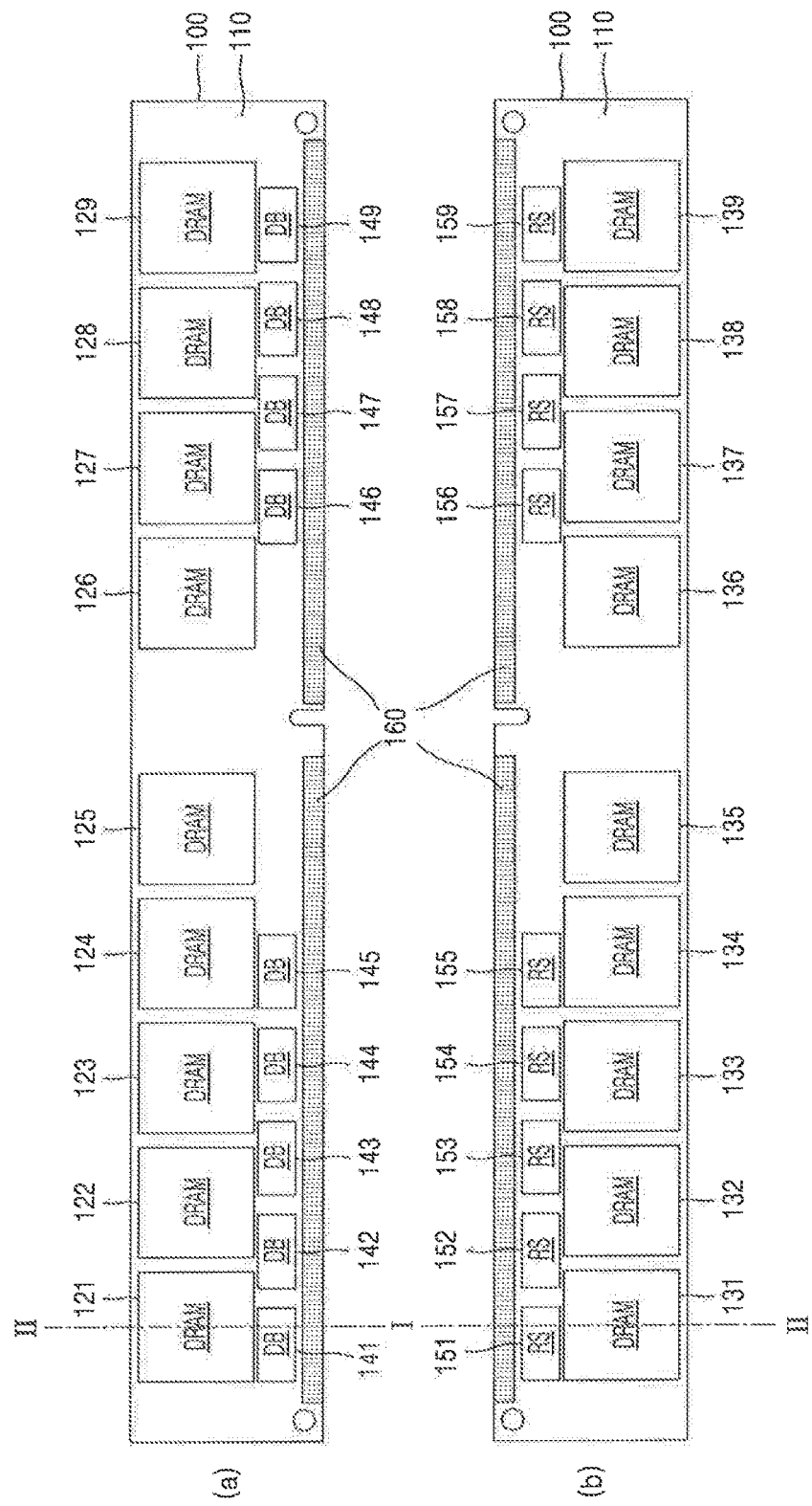
FIG. 1 is a diagram illustrating a memory module according to an exemplary embodiment of the inventive concept.

Hereinafter, exemplary embodiments of the inventive concept will be described more fully with reference to the accompanying drawings.

This inventive concept may, however, be embodied in many different forms and should not be construed as limited to the exemplary embodiments set forth herein. Like reference numerals in the drawings may denote like elements, and dimensions of elements may be exaggerated for clarity.

As used herein, the singular forms "a", "an" and "the" are intended to include the plural forms as well, unless the context clearly indicates otherwise.

In the following, it is to be understood that a data storage memory installed in a data processing system, such as a personal computer, a server computer, a workstation, or a communication system, may be in a form of a memory module wherein memory chips are mounted on a printed circuit board (PCB). The memory module may be inserted into a socket connector of the data processing system. An electric connector (or pin) of the memory module may be connected to an electric contact in the socket connector. The data processing system may access the memory chips through a bus connecting the electric connector of the memory module and the electric contact of the socket connector.

The bus may be classified into a data bus and a control bus. The data bus may include a line for a data input/output (I/O) signal DQ and the control bus may include at least one of a line for a command CMD, a line for an address ADDR, and a line for a clock CLK. The data bus and the control bus may be connected to the memory chips. In response to a high speed data process request of the data processing system, the data bus may be required to achieve a higher frequency. In other words, the data bus may be requested to stably operate at a high data rate. An exemplary embodiment of the present invention provides a memory module configured to reduce a path of the data I/O signal DQ between a resistance unit and a data buffer, and thus, may guarantee fidelity of the data I/O signal DQ during a high data rate operation.

FIG. 1 illustrates plan views of a memory module 100 according to an exemplary embodiment of the inventive concept. FIG. 1 (a) is a plan view of a first surface of the memory module 100 and FIG. 1 (b) is a plan view of a second surface of the memory module 100, which is an opposite surface of the first surface.

Referring to FIG. 1, the memory module 100 includes memory chips 121 through 129 and 131 through 139, data buffers 141 through 149, resistance units 151 through 159, and a tab 160, which are mounted on a surface layer (e.g., uppermost layer or lowermost layer) of a PCB 110. The memory module 100 may be a load reduced dual in-line memory module (LR-DIMM).

The number of memory chips 121 through 129 and 131 through 139 may be determined based on a structure and I/O configuration of the memory module 100. For example, in case of a 1-rank LR-DIMM having an I/Ox72 configuration, 18 memory chips having an I/Ox4 configuration may be mounted on a memory module. Alternatively, 9 memory chips having an I/Ox8 configuration may be mounted on a memory module.

In the current embodiment, 9 memory chips having the I/Ox8 configuration in the 1-rank LR-DIMM having the I/Ox72 configuration are mounted on the memory module 100. Here, 9 memory chips 121 through 129 are mounted on the first surface of the memory module 100 and 9 memory chips 131 through 139 are mounted on the second surface of the memory module 100.

The memory chips 121 through 129 on the first surface may be respectively connected to the memory chips 131 through 139 on the second surface through a thru-via hole (TVH) or a blind-via-hole (BVH) of the PCB 110. Such a structure may be used to expand a memory capacity of the memory module 100. According to an exemplary embodiment of the inventive concept, 9 memory chips may be mounted on any one of the first and second surfaces of the memory module 100.

The memory chips 121 through 129 on the first surface of the memory module 100 may be correspondingly connected to the data buffers 141 through 149. When the PCB 110 of the memory module 100 is formed of a multilayer, signal lines for correspondingly and respectively connecting electric connection pads of the memory chips 121 through 129 and electric connection pads of the data buffers 141 through 149 may be formed in an internal layer of the multilayer. The signal lines may transfer the data I/O signal DQ. The data buffers 141 through 149 may buffer the data I/O signal DQ that is input from or output to the memory module 100.

The resistance units 151 through 159 spaced apart from the memory chips 131 through 139 are disposed on the second surface of the memory module 100. The resistance units 151 through 159 may be arranged in a damping resistance array to prevent a signal reflection phenomenon, such as overshoot or undershoot. The resistance units 151 through 159 may be arranged correspondingly to the memory chips 131 through 139, and indirectly connected correspondingly to the memory chips 131 through 139. Since the memory chips 131 through 139 are electrically respectively connected to the memory chips 121 through 129 on the first surface of the PCB 110, the resistance units 151 through 159 may be indirectly connected to the memory chips 121 through 129. Since the resistance units 151 through 159 are disposed on the second surface of the PCB 110, which is opposite to the first surface where the data buffers 141 through 149 are disposed, a size of the memory module 100 may not be increased due to an arrangement of the resistance units 151 through 159.

The tab 160 is formed on edge portions of the first and second surfaces of the PCB 110. The tab 160 may include a plurality of connecting terminals also referred to as tab pins. The tab 160 may include command/address signal input pins, no connection pins, and data I/O signal pins. Data tab pins for transmitting the data I/O signal DQ from the tab 160 may be connected to the resistance units 151 through 159 on the second surface of the PCB 110. The resistance units 151 through 159 corresponding to the memory chips 131 through 139 may be respectively connected to the data buffers 141 through 149 on the first surface through the TVH or BVH of the PCB 110.

To transmit the data I/O signal DQ to and from the memory chips 121 through 129 and 131 through 139, a data bus connected to the data tab pins, the resistance units 151 through 159 and the data buffers 141 through 149 which correspond to the memory chips 121 through 129 and 131 through 139, and the memory chips 121 through 129 and 131 through 139 may be used.

Figure 2:
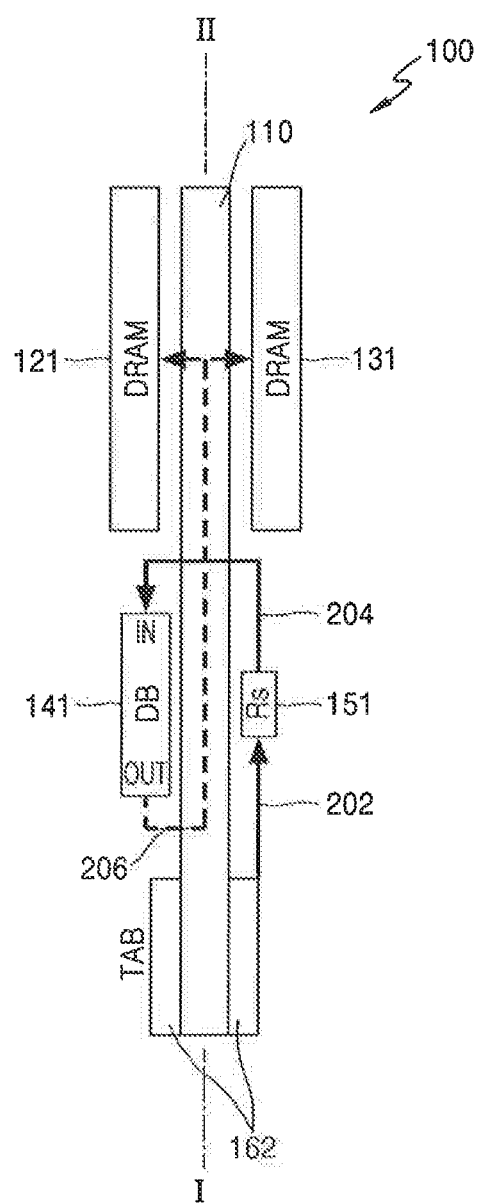
FIG. 2 is a diagram illustrating a data bus wiring of the memory module of FIG. 1, according to an exemplary embodiment of the inventive concept.

FIG. 2 is a diagram illustrating a data bus wiring of the memory module 100 of FIG. 1, according to an exemplary embodiment of the inventive concept. FIG. 2 is a cross-sectional view taken along a line I-II of FIG. 1.

Referring to FIG. 2, a memory chip 121 and a memory buffer 141 are disposed on the first surface of the PCB 110 and a memory chip 131 and a resistance unit 151 are disposed on the second surface of the PCB 110. A first wiring 202 is formed between a data tab pin 162 of the PCB 110 and the resistance unit 151, and a second wiring 204 penetrating through the PCB 110 is formed between the resistance unit 151 and the data buffer 141. A first terminal of the resistance unit 151 may be connected to the first wiring 202 and a second terminal of the resistance unit 151 may be connected to the second wiring 204.

The second wiring 204 penetrating through the PCB 110 on the second surface of the PCB 110 may be connected to an input terminal IN of the memory buffer 141 on the first surface of the PCB 110. A third wiring 206 connected to an output terminal OUT of the memory buffer 141 may be laid out on the internal layer of the PCB 110, and may be connected to the data I/O signal DQ of the memory chips 121 and 131. For convenience of understanding, the second wiring 204 and the third wiring 206 are disposed in one cross-section. However, the second wiring 204 and the third wiring 206 may be electrically separated according to arrangements of the resistance unit 151 on the second surface of the PCB 110 and the memory buffer 141 on the first surface of the PCB 110.

The memory buffer 141 on the first surface of the PCB 110 may have the output terminal OUT disposed adjacent to the data tab pin 162 and the input terminal IN disposed adjacent to the memory chip 121. Accordingly, a length of the second wiring 204 connected between the input terminal IN of the memory buffer 141 and the resistance unit 151 may be shortened. Thus, a path of the data I/O signal DQ may be reduced to prevent an attenuation phenomenon of the data I/O signal DQ, thereby increasing fidelity of the data I/O signal DQ.

Figure 3:
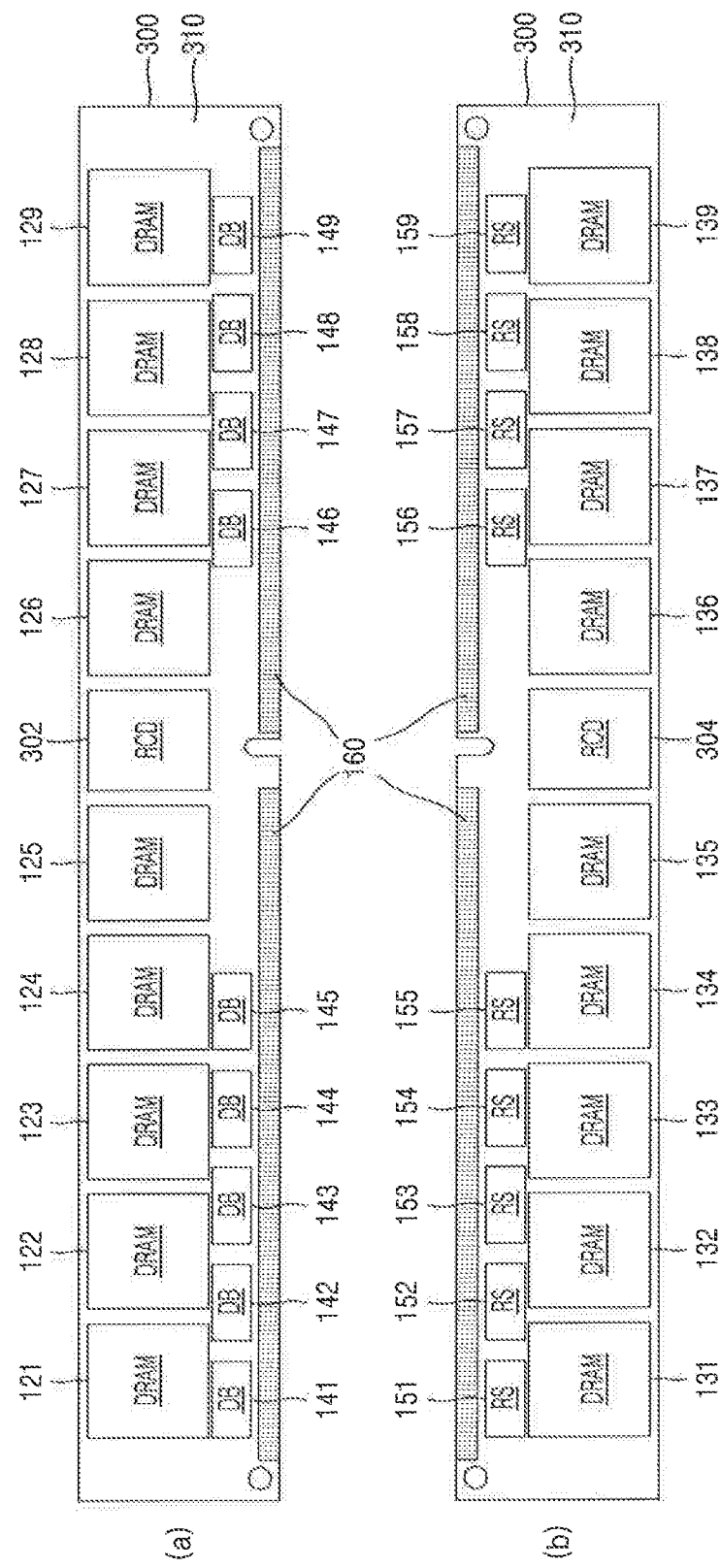
FIG. 3 is a diagram illustrating a memory module according to an exemplary embodiment of the inventive concept.

FIG. 3 illustrates plan views of a memory module 300 according to an exemplary embodiment of the inventive concept. FIG. 3 (a) is a plan view of a first surface of the memory module 300 and FIG. 3 (b) is a plan view of a second surface of the memory module 300, which is an opposite surface of the first surface.

Referring to FIG. 3, the memory module 300 is different from the memory module 100 of FIG. 1 in that the memory module 300 further includes registers 302 and 304 on two surfaces of a PCB 310. The registers 302 and 304 may have a function of buffering and re-driving a command, an address, a control signal, and a clock signal received through the tab 160. The command, the address, the control signal, and the clock signal output from the registers 302 and 304 may be provided to the memory chips 121 through 129 and 131 through 139. For example, the command, the address, the control signal, and the clock signal may be provided through a common signal wiring of the memory chips 121 through 129 and 131 through 139 on corresponding surfaces where the registers 302 and 304 are disposed, through an individual signal wiring of the memory chips 121 through 129 and 131 through 139, or through each signal wiring of some of the memory chips 121 through 129 and 131 through 139.

Figure 4:
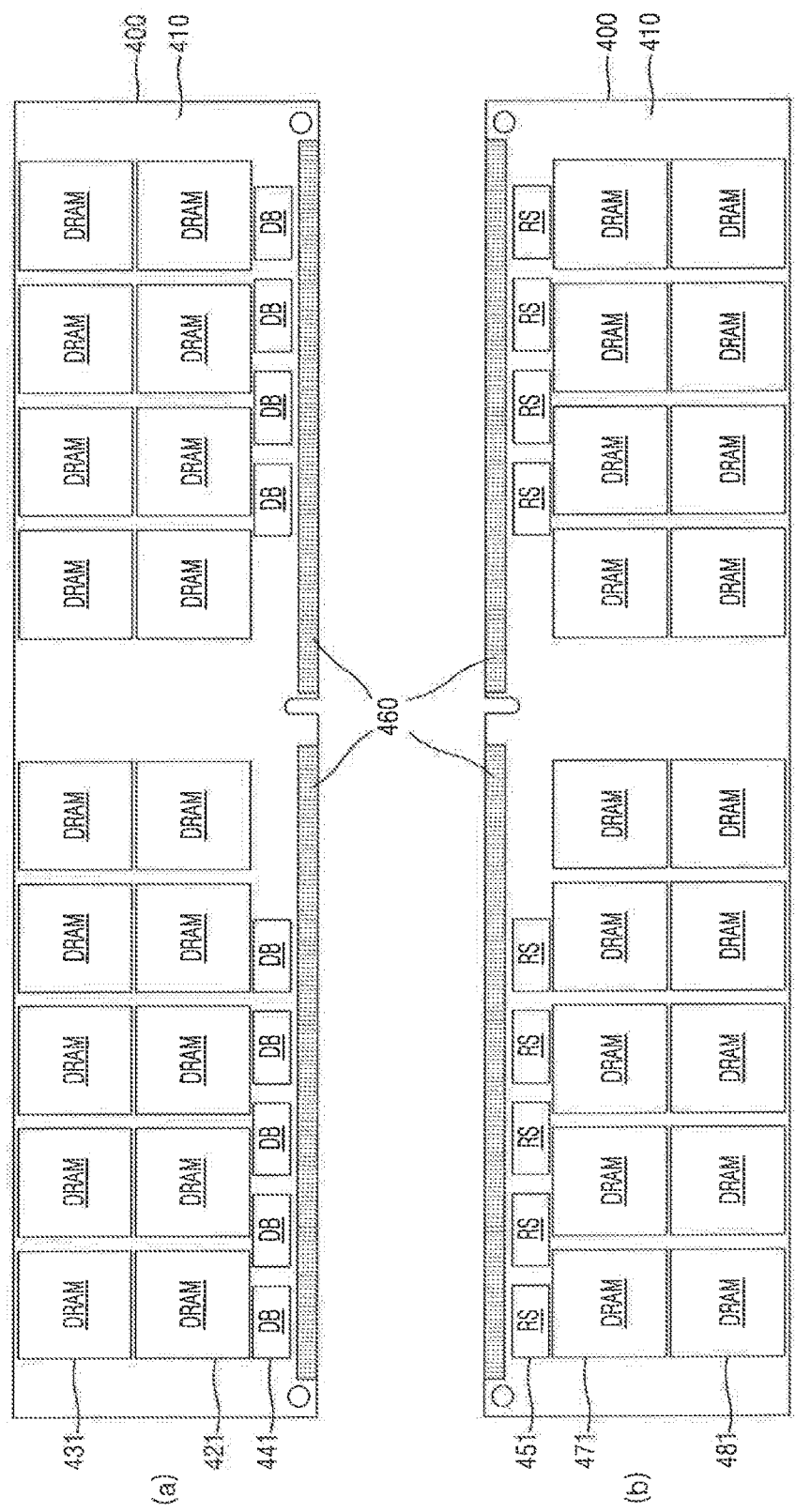
FIG. 4 is a diagram illustrating a memory module according to an exemplary embodiment of the inventive concept.

FIG. 4 illustrates plan views of a memory module 400 according to an exemplary embodiment of the inventive concept. FIG. 4 (a) is a plan view of a first surface of the memory module 400 and FIG. 4 (b) is a plan view of a second surface of the memory module 400, which is an opposite surface of the first surface.

Referring to FIG. 4, the memory module 400 may include a plurality of memory chips 421 and 431 arranged in two rows and data buffers 441 correspondingly connected to the memory chips 421 and 431 on a first surface of a PCB 410, and a plurality of memory chips 471 and 481 arranged in two rows and resistance units 451 correspondingly connected to the memory chips 471 and 481 on a second surface of the PCB 410. The data buffers 441 are disposed adjacent to a tab 460 on the first surface and the resistance units 451 are disposed adjacent to the tab 460 on the second surface.

In the current embodiment, 18 memory chips having an I/Ox4 configuration are mounted on the memory module 400 in a 1-rank LR-DIMM having an I/Ox72 configuration. The 9 memory chips 421 are disposed on a first row and the 9 memory chips 431 are disposed on a second row on the first surface of the memory module 400, and the 9 memory chips 471 are disposed on a first row and the 9 memory chips 481 are disposed on a second row on the second surface of the memory module 400.

The memory chips 421 on the first row on the first surface may be respectively connected to the memory chips 471 on the first row on the second surface through a TVH or BVH of the PCB 410. The memory chips 431 on the second row on the first surface may be respectively connected to the memory chips 481 on the second row on the second surface through the TVH or BVH of the PCB 410. Such a structure may be used to expand a memory capacity of the memory module 400. According to an exemplary embodiment of the inventive concept, 18 memory chips may be mounted on one of the first and second surfaces of the memory module 400.

As described above with reference to FIG. 2, a data bus wiring of the memory module 400 may include a first wiring connected between a data tab pin of the tab 460 of the PCB 410 and the resistance unit 451, a second wiring connected between the resistance unit 451 and an input terminal of the data buffer 441 and penetrating through the PCB 410, and a third wiring connected between an output terminal of the data buffer 441 and a data I/O signal DQ of the memory chips 421, 431, 471 or 481 and laid out on an internal layer of the PCB 410.

Figure 5:
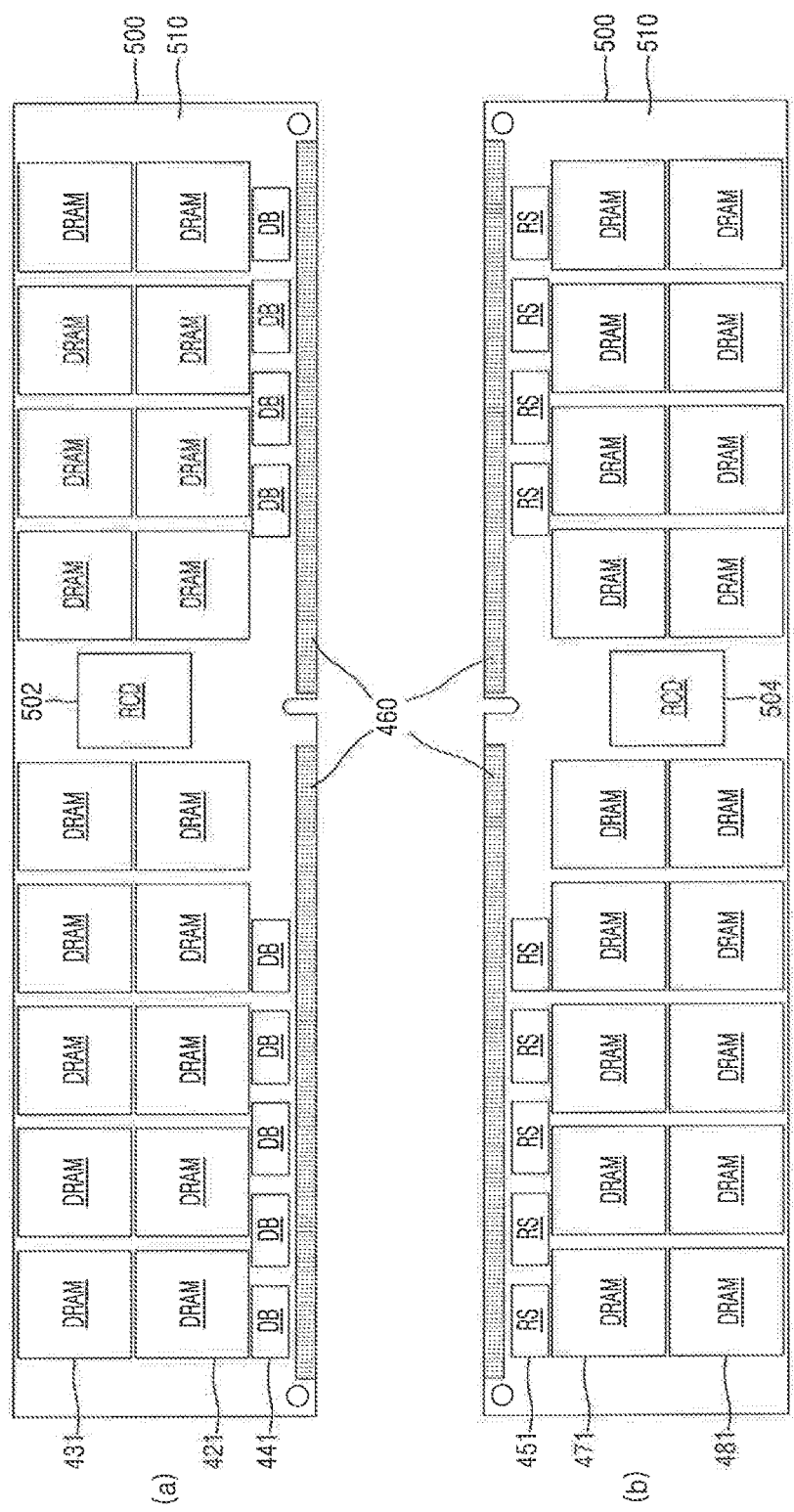
FIG. 5 is a diagram illustrating a memory module according to an exemplary embodiment of the inventive concept.

FIG. 5 is a diagram illustrating a memory module 500 according to an exemplary embodiment of the inventive concept. FIG. 5 (a) is a plan view of a first surface of the memory module 500 and FIG. 5 (b) is a plan view of a second surface of the memory module 500, which is an opposite surface of the first surface.

Referring to FIG. 5, the memory module 500 is different from the memory module 400 of FIG. 4 in that the memory module 500 further includes registers 502 and 504 on two surfaces of a PCB 510. The registers 502 and 504 may have a function of buffering and re-driving a command, an address, a control signal, and a clock signal received through the tab 460. The command, the address, the control signal, and the clock signal output from the registers 502 and 504 may be provided to the memory chips 421, 431, 471, and 481. For example, the command, the address, the control signal, and the clock signal may be provided through a common signal wiring of the memory chips 421, 431, 471, and 481 on corresponding surfaces where the registers 502 and 504 are disposed, through an individual signal wiring of the memory chips 421, 431, 471, and 481, or through each signal wiring of some of the memory chips 421, 431, 471, and 481.

Figure 6:
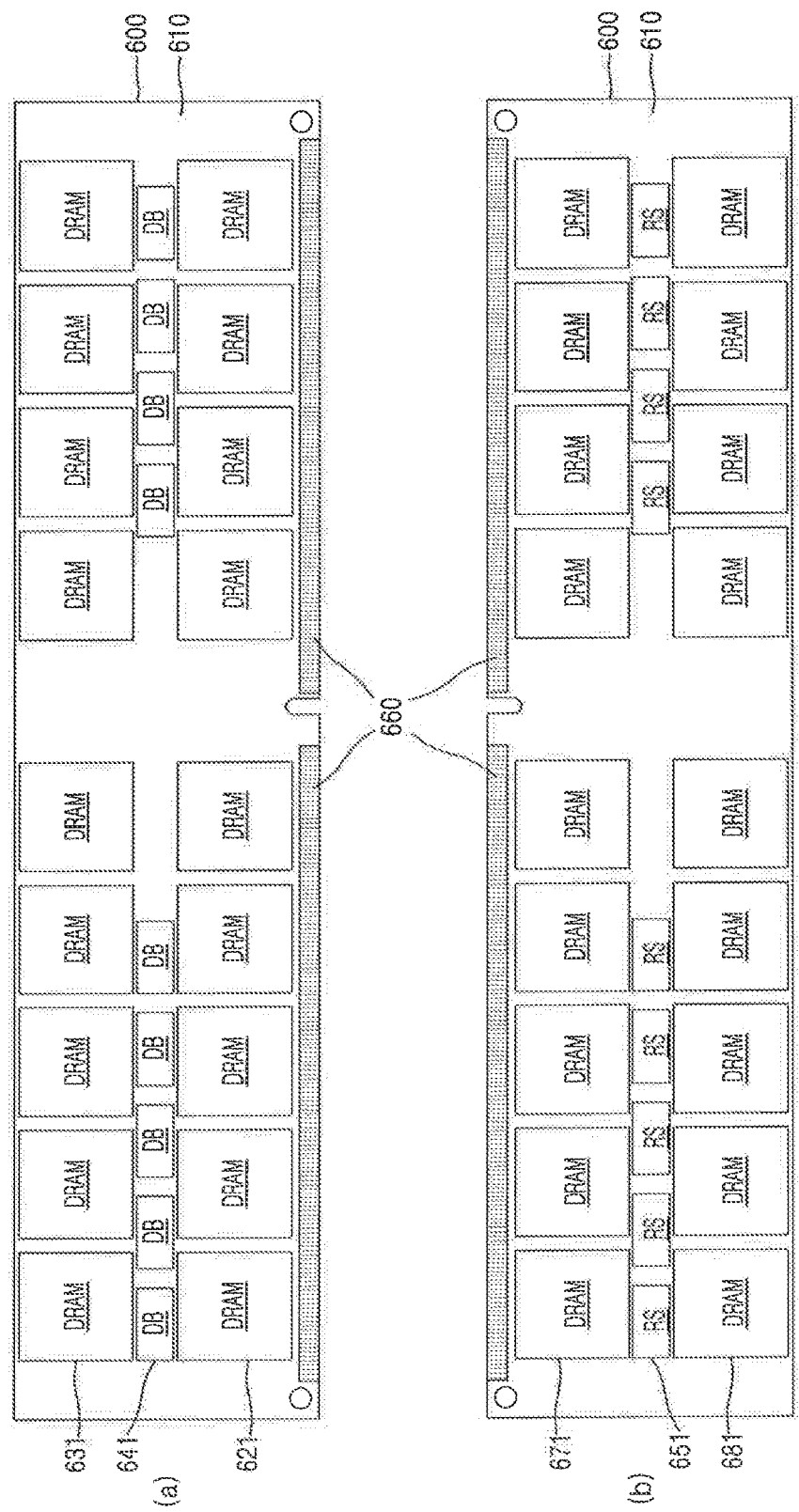
FIG. 6 is a diagram illustrating a memory module according to an exemplary embodiment of the inventive concept.

FIG. 6 is a diagram illustrating a memory module 600 according to an exemplary embodiment of the inventive concept. FIG. 6 (a) is a plan view of a first surface of the memory module 600 and FIG. 6 (b) is a plan view of a second surface of the memory module 600, which is an opposite surface of the first surface.

Referring to FIG. 6, the memory module 600 includes a plurality of memory chips 621 and 631 arranged in two rows and data buffers 641 correspondingly respectively connected to the memory chips 621 and 631 on a first surface of a PCB 610, and a plurality of memory chips 671 and 681 arranged in two rows and resistance units 651 correspondingly respectively connected to the memory chips 671 and 681 on a second surface of the PCB 610.

The memory chips 621 on the first row on the first surface may be respectively connected to the memory chips 671 on the first row on the second surface through a TVH or BVH of the PCB 610, and the memory chips 631 on the second row on the first surface may be respectively connected to the memory chips 681 on the second row on the second surface through the TVH or BVH of the PCB 610.

The data buffers 641 may be disposed between the memory chips 621 on the first row and the memory chips 631 on the second row on the first surface. The resistance units 651 may be disposed between the memory chips 671 on the first row and the memory chips 681 on the second row on the second surface.

As described above with reference to FIG. 2, a data bus wiring of the memory module 600 may include a first wiring connected between a data tab pin of a tab 660 of the PCB 610 and the resistance unit 651, a second wiring connected between the resistance unit 651 and an input terminal of the data buffer 641 and penetrating through the PCB 610, and a third wiring connected between an output terminal of the data buffer 641 and a data I/O signal DQ of the memory chips 621, 631, 671 or 681 and laid out on an internal layer of the PCB 610.

Figure 7:
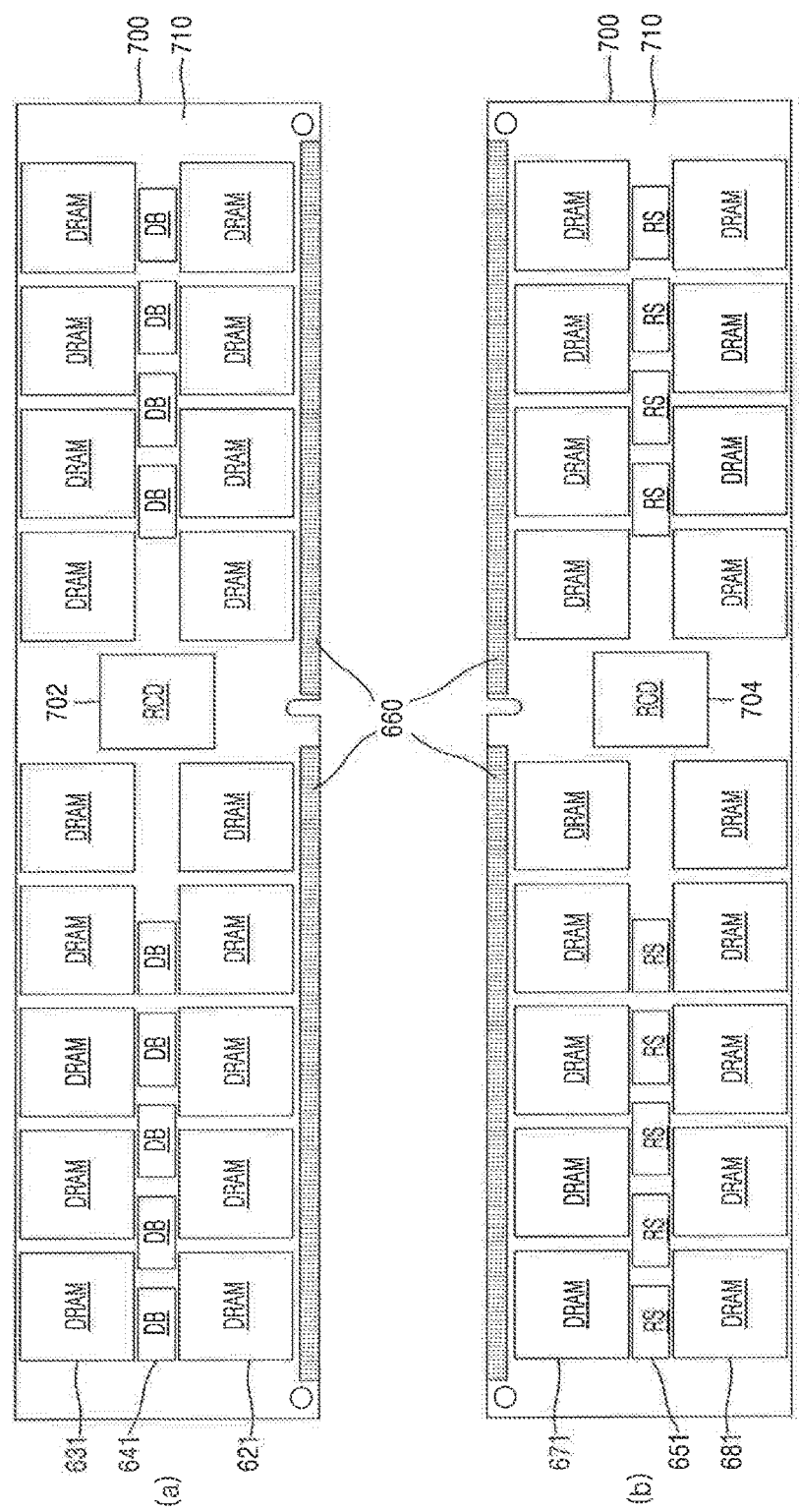
FIG. 7 is a diagram illustrating a memory module according to an exemplary embodiment of the inventive concept.

FIG. 7 is a diagram illustrating a memory module 700 according to an exemplary embodiment of the inventive concept. FIG. 7 (a) is a plan view of a first surface of the memory module 700 and FIG. 1 (b) is a plan view of a second surface of the memory module 700, which is an opposite surface of the first surface.

Referring to FIG. 7, the memory module 700 is different from the memory module 600 of FIG. 6 in that the memory module 700 further includes registers 702 and 704 on two surfaces of a PCB 710. The registers 702 and 704 may buffer and re-drive a command, an address, a control signal, and a clock signal received through the tab 660, and provide the command, the address, the control signal, and the clock signal to the memory chips 621, 631, 671, and 681.

Figure 8:
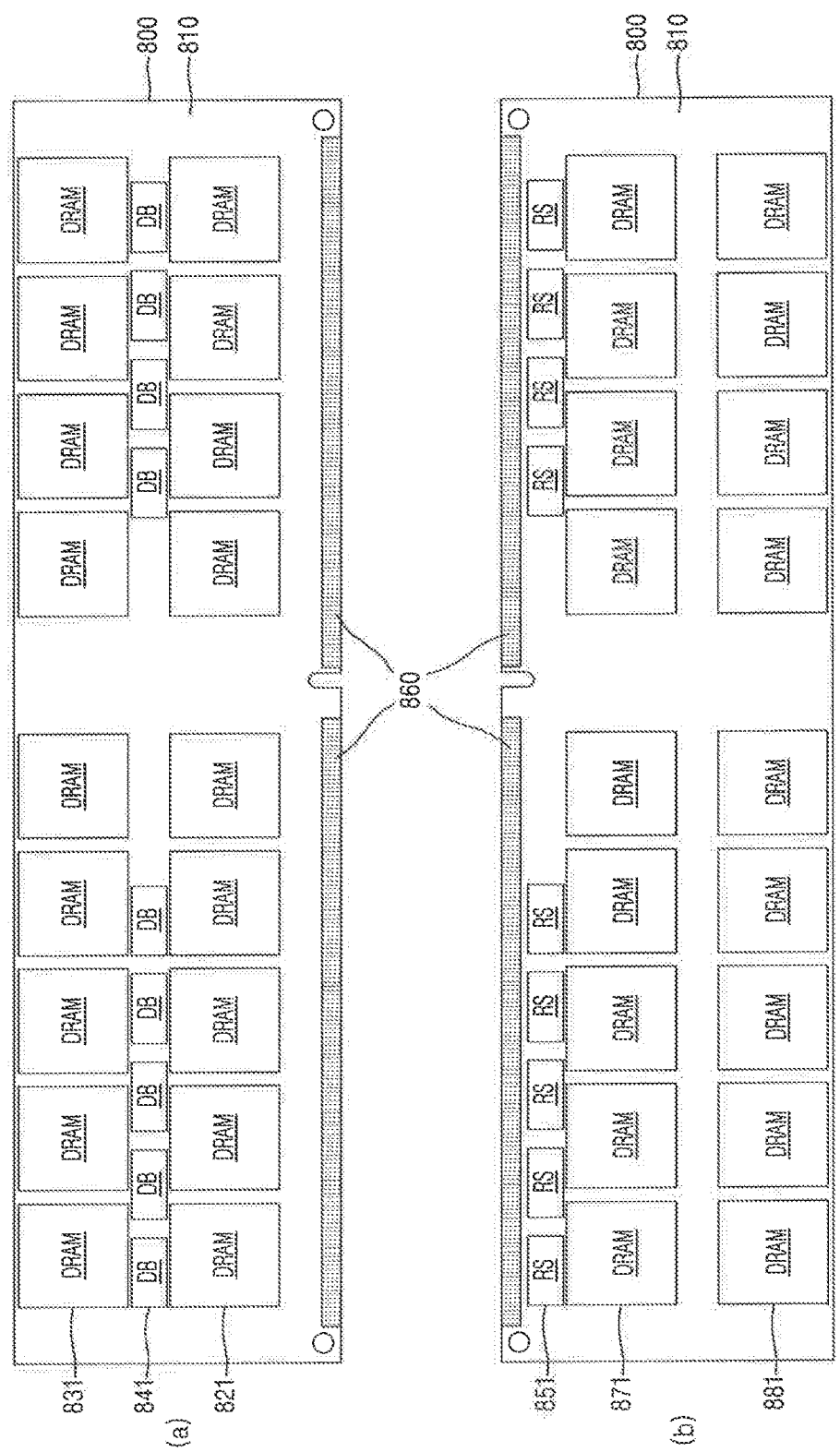
FIG. 8 is a diagram illustrating a memory module according to an exemplary embodiment of the inventive concept.

FIG. 8 is a diagram illustrating a memory module 800 according to an exemplary embodiment of the inventive concept. FIG. 8 (a) is a plan view of a first surface of the memory module 800 and FIG. 8 (b) is a plan view of a second surface of the memory module 800, which is an opposite surface of the first surface.

Referring to FIG. 8, the memory module 800 includes a plurality of memory chips 821 and 831 arranged in two rows and data buffers 841 correspondingly respectively connected to the memory chips 821 and 831 on a first surface of a PCB 810, and a plurality of memory chips 871 and 881 arranged in two rows and resistance units 851 correspondingly respectively connected to the memory chips 871 and 881 on a second surface of the PCB 810.

The memory chips 821 on the first row on the first surface may be respectively connected to the memory chips 871 on the first row on the second surface through a TVH or BVH of the PCB 810, and the memory chips 831 on the second row on the first surface may be respectively connected to the memory chips 881 on the second row on the second surface through the TVH or BVH of the PCB 810.

The data buffers 841 may be disposed between the memory chips 821 on the first row on the first surface and the memory chips 831 on the second row on the first surface. The resistance units 851 may be disposed adjacent to a tab 860 on the second surface.

As described above with reference to FIG. 2, a data bus wiring of the memory module 800 may include a first wiring connected between a data tab pin of the tab 860 of the PCB 810 and the resistance unit 851, a second wiring connected between the resistance unit 851 and an input terminal of the data buffer 841 and penetrating through the PCB 810, and a third wiring connected between an output terminal of the data buffer 841 and a data I/O signal DQ of the memory chip 821, 831, 871, or 881 and laid out on an internal layer of the PCB 810.

Figure 9:
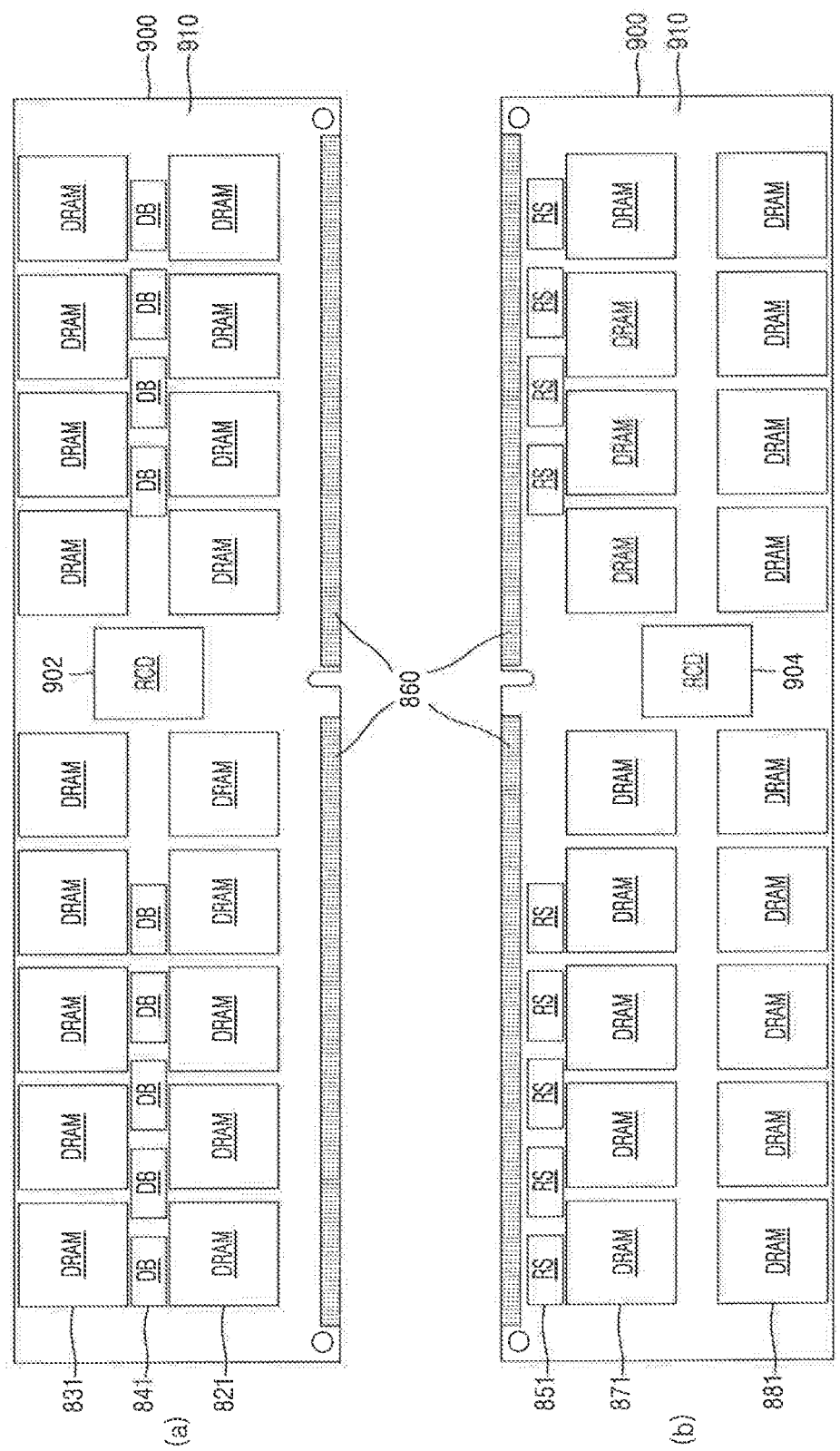
FIG. 9 is a diagram illustrating a memory module according to an exemplary embodiment of the inventive concept.

FIG. 9 is a diagram illustrating a memory module 900 according to an exemplary embodiment of the inventive concept. FIG. 9 (a) is a plan view of a first surface of the memory module 900 and FIG. 9 (b) is a plan view of a second surface of the memory module 900, which is an opposite surface of the first surface.

Referring to FIG. 9, the memory module 900 is different from the memory module 800 of FIG. 8 in that the memory module 900 further includes registers 902 and 904 on two surfaces of a PCB 910. The registers 902 and 904 may buffer and re-drive a command, an address, a control signal, and a clock signal received through the tab 860, and provide the command, the address, the control signal, and the clock signal to the memory chips 821, 831, 871, and 881.

Figure 10:
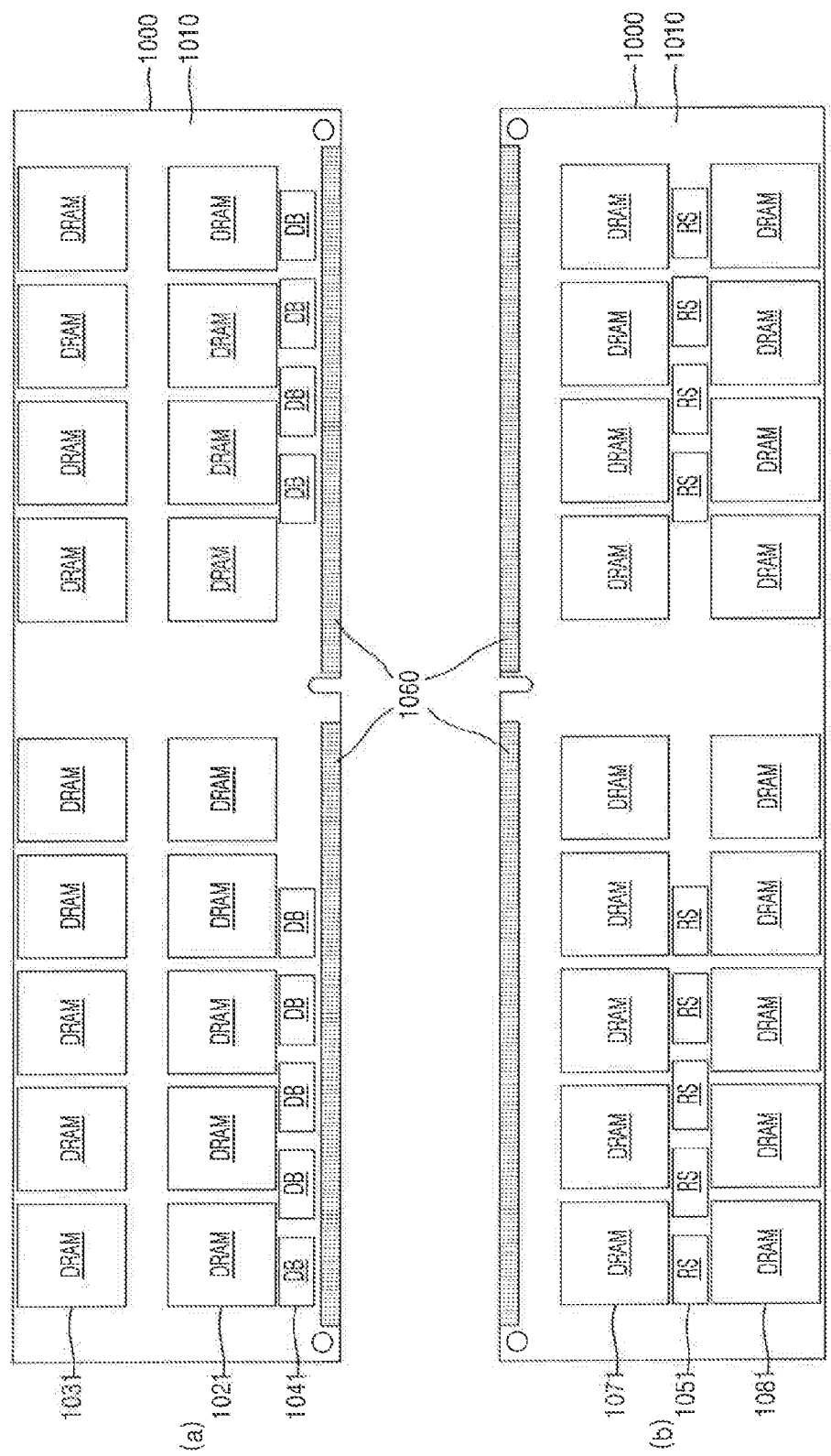
FIG. 10 is a diagram illustrating a memory module according to an exemplary embodiment of the inventive concept.

FIG. 10 is a diagram illustrating a memory module 1000 according to an exemplary embodiment of the inventive concept. FIG. 10 (a) is a plan view of a first surface of the memory module 1000 and FIG. 10 (b) is a plan view of a second surface of the memory module 1000, which is an opposite surface of the first surface.

Referring to FIG. 10, the memory module 1000 includes a plurality of memory chips 1021 and 1031 arranged in two rows and data buffers 1041 correspondingly respectively connected to the memory chips 1021 and 1031 on a first surface of a PCB 1010, and a plurality of memory chips 1071 and 1081 arranged in two rows and resistance units 1051 correspondingly respectively connected to the memory chips 1071 and 1081 on a second surface of the PCB 1010.

The memory chips 1021 on the first row on the first surface may be respectively connected to the memory chips 1071 on the first row on the second surface through a TVH or BVH of the PCB 1010, and the memory chips 1031 on the second row on the first surface may be respectively connected to the memory chips 1081 on the second row on the second surface through the TVH or BVH of the PCB 1010.

The data buffers 1041 may be disposed adjacent to a tab 1060 on the first surface. The resistance units 1051 may be disposed between the memory chips 1071 on the first row on the second surface and the memory chips 1081 on the second row on the second surface.

As described above with reference to FIG. 2, a data bus wiring of the memory module 1000 may include a first wiring connected between a data tab pin of the tab 1060 of the PCB 1010 and the resistance unit 1051, a second wiring connected between the resistance unit 1051 and an input terminal of the data buffer 1041 and penetrating through the PCB 1010, and a third wiring connected between an output terminal of the data buffer 1041 and a data I/O signal DQ of the memory chip 1021, 1031, 1071, or 1081 and laid out on an internal layer of the PCB 1010.

Figure 11:
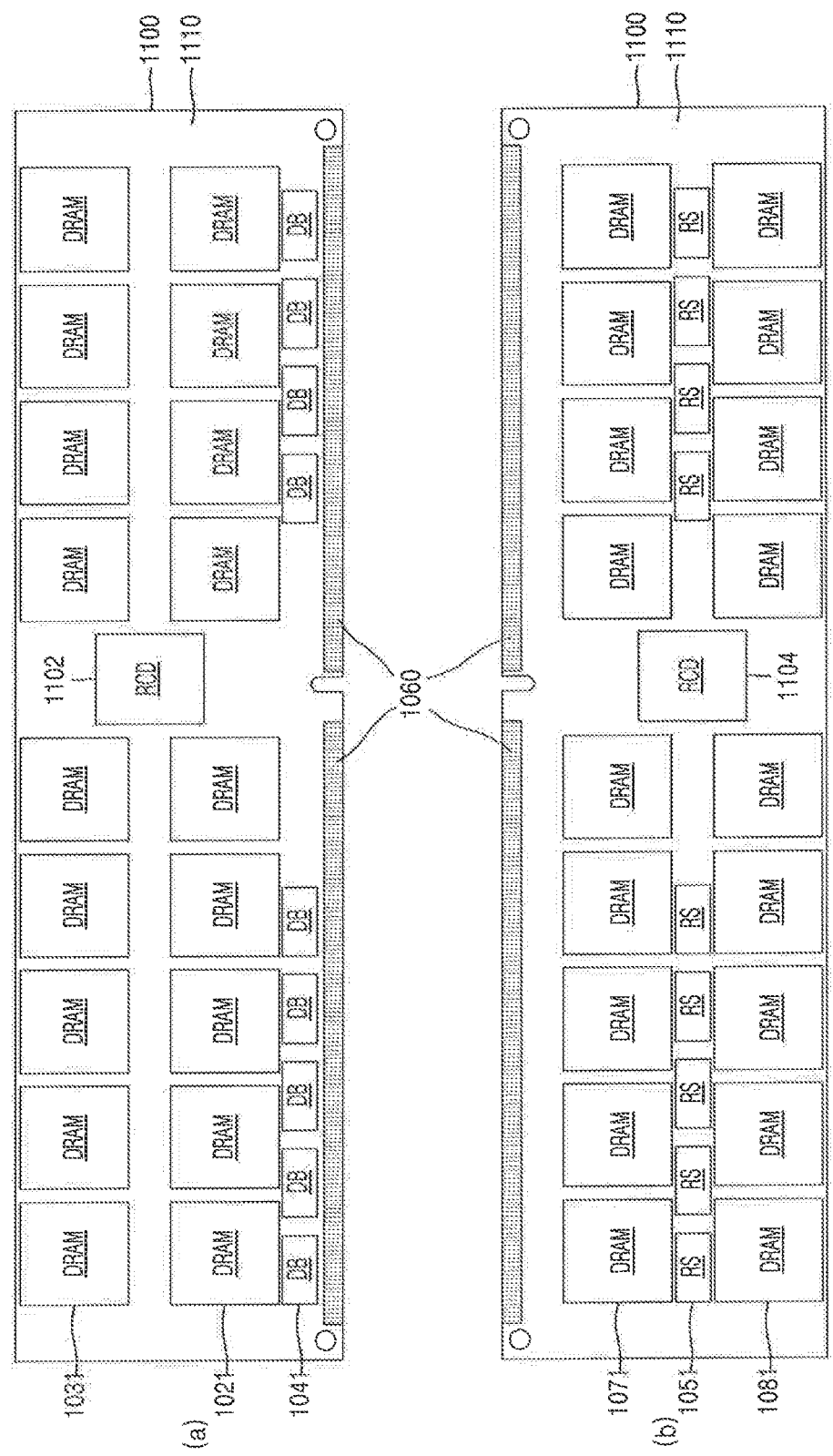
FIG. 11 is a diagram illustrating a memory module according to an exemplary embodiment of the inventive concept.

FIG. 11 is a diagram illustrating a memory module 1100 according to an exemplary embodiment of the inventive concept. FIG. 11 (a) is a plan view of a first surface of the memory module 1100 and FIG. 11 (b) is a plan view of a second surface of the memory module 1100, which is an opposite surface of the first surface.

Referring to FIG. 11, the memory module 1100 is different from the memory module 1000 of FIG. 10 in that the memory module 1100 further includes registers 1102 and 1104 on two surfaces of a PCB 1110. The registers 1102 and 1104 may buffer and re-drive a command, an address, a control signal, and a clock signal received through the tab 1060, and provide the command, the address, the control signal, and the clock signal to the memory chips 1021, 1031, 1071, and 1081.

Figure 12:
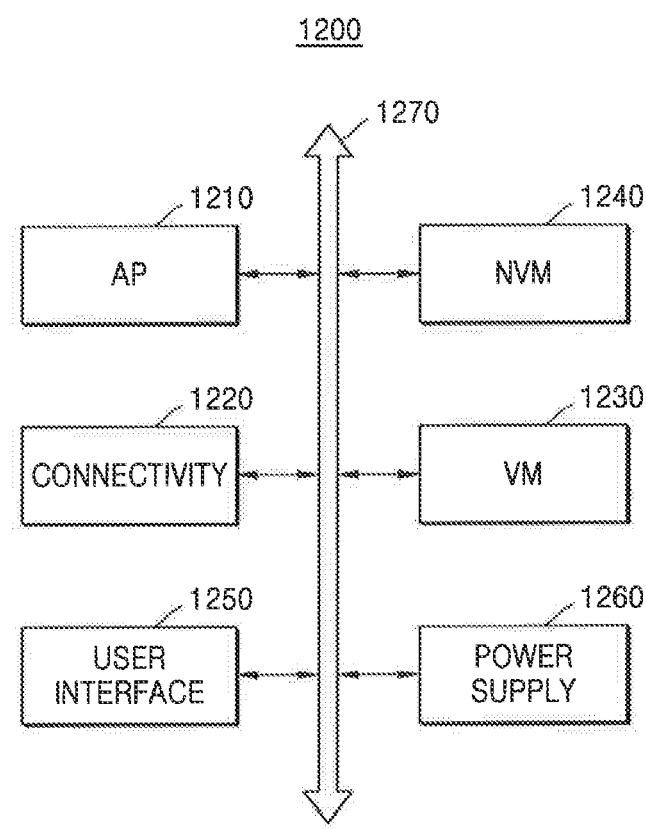
FIG. 12 is a block diagram showing a memory module including a resistance unit and a data buffer applied to a mobile system, according to an exemplary embodiment of the inventive concept.

FIG. 12 is a block diagram showing a memory module including a resistance unit and a data buffer applied to a mobile system 1200, according to an exemplary embodiment of the inventive concept.

Referring to FIG. 12, the mobile system 1200 may include an application processor 1210, a connectivity unit 1220, a volatile memory device 1230, a nonvolatile memory device 1240, a user interface 1250, and a power supply source 1260. The components of the mobile system 1200 may communicate over a bus 1270. According to an exemplary embodiment of the inventive concept, the mobile system 1200 may be a variety of mobile systems, such as a mobile phone, a smart phone, a personal digital assistant (PDA), a portable multimedia player (PMP), a digital camera, a music player, a portable game console, or a navigation system.

The application processor 1210 may execute applications for providing an Internet browser, a game, and moving images. According to an exemplary embodiment of the inventive concept, the application processor 1210 may include one processor core (e.g., a single core) or a plurality of processor cores (e.g., a multi-core). For example, the application processor 1210 may include a dual-core, a quid-core, or a hexa-core. According to an exemplary embodiment of the inventive concept, the application processor 1210 may further include an internal or external cache memory.

The connectivity unit 1220 may perform wireless communication or wired communication with an external device. For example, the connectivity unit 1220 may perform Ethernet communication, near field communication (NFC), radio frequency identification (RFID) communication, mobile telecommunication, memory card communication, or universal serial bus (USB) communication. For example, the connectivity unit 1220 may include a baseband chipset, and support communication, such as global system for mobile communications (GSM), general packet radio service (GRPS), wideband code division multiple access (WCDMA), or high speed packet access (HSxPA).

The volatile memory device 1230 may store data processed by the application processor 1210 or operate as a working memory. The volatile memory device 1230 may be realized as a memory module on which a resistance unit and a data buffer are mounted, according to an exemplary embodiment of the inventive concept. The volatile memory device 1230 may include first memory chips arranged on a PCB, data buffers disposed on a first surface of the PCB and correspondingly connected to the first memory chips, and resistance units disposed on a second surface of the PCB, which is an opposite surface of the first surface, and correspondingly connected to the data buffers, for example. As another example, the volatile memory device 1230 may include at least one memory chip arranged on a PCB, a data buffer disposed on a first surface of the PCB and having an output terminal connected to the memory chip, and a resistance unit disposed adjacent to a connecting terminal of a tab of the PCB, which is disposed on the second surface, having a first terminal connected to the connecting terminal, and having a second terminal connected to an input terminal of the data buffer through a first via hole penetrating through the PCB. The input terminal of the data buffer may be disposed adjacent to the memory chip and the output terminal of the data buffer may be disposed adjacent to the connecting terminal.

The nonvolatile memory device 1240 may store a boot image for booting the mobile system 1200. For example, the nonvolatile memory device 1240 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), or a similar memory.

The user interface 1250 may include at least one input device, such as a keypad or a touch screen, and/or at least one output device, such as a speaker or a display device. The power supply source 1260 may supply an operation voltage. According to an exemplary embodiment of the inventive concept, the mobile system 1200 may further include a camera image processor (CIP), and may further include a storage device, such as a memory card, a solid state drive (SDD), a hard disk drive (HDD), or a compact disk read only memory (CD-ROM).

Figure 13:
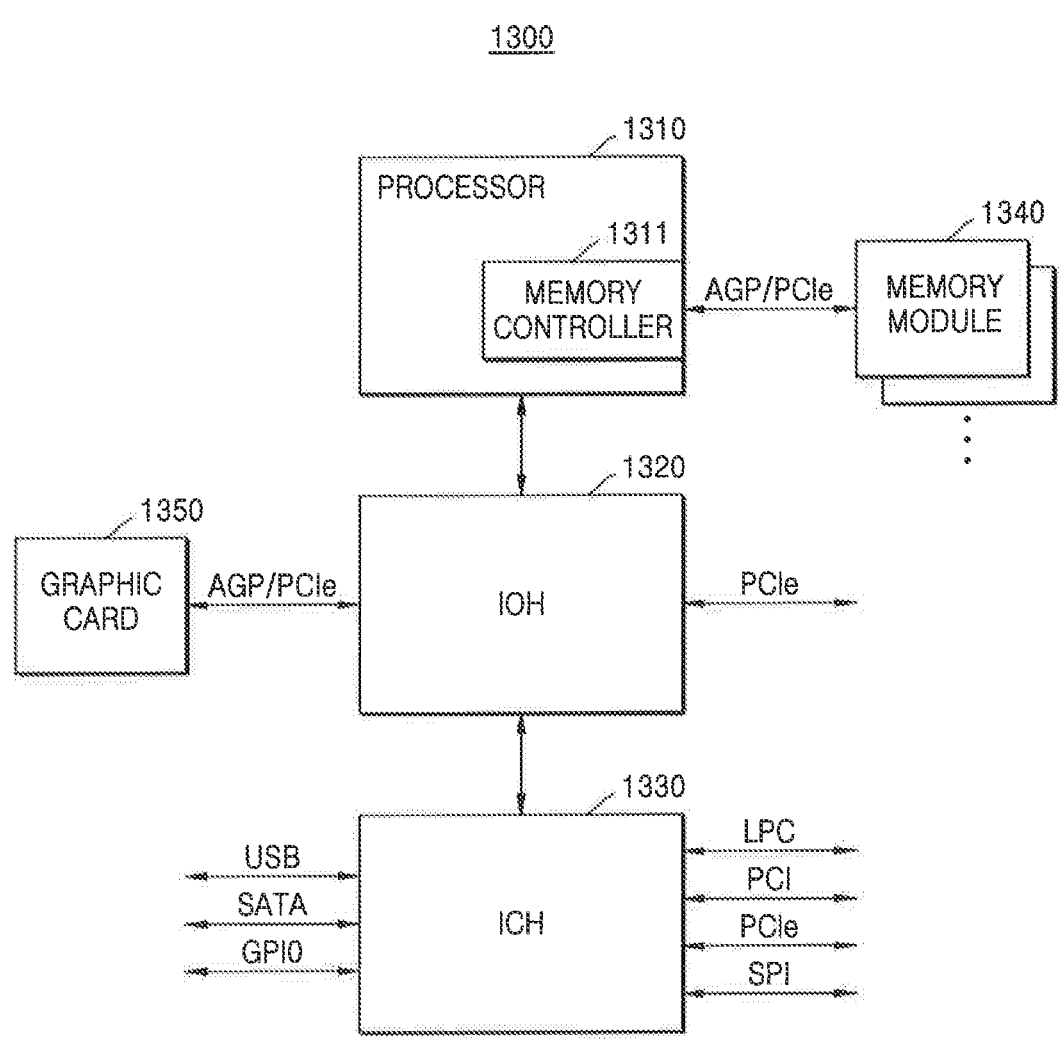
FIG. 13 is a block diagram showing a memory module including a resistance unit and a data buffer applied to a computer system, according to an exemplary embodiment of the inventive concept.

FIG. 13 is a block diagram showing a memory module including a memory chip and a buffer chip applied to a computer system 1300, according to an exemplary embodiment of the inventive concept.

Referring to FIG. 13, the computer system 1300 includes a processor 1310, an I/O hub 1320, an I/O controller hub 1330, at least one memory module 1340, and a graphic card 1350. According to an exemplary embodiment of the inventive concept, the computer system 1300 may be a variety of computer systems, such as a personal computer (PC), a server computer, a workstation, a laptop, a mobile phone, a smart phone, a PDA, a PMP, a digital camera, a digital television (DTV), a set-top box, a music player, a portable game console, or a navigation system.

The processor 1310 may perform various computing functions, such as certain calculations or tasks. For example, the processor 1310 may be a microprocessor or a central processing unit (CPU). According to an exemplary embodiment of the inventive concept, the processor 1310 may include one processor core (e.g., a single core) or a plurality of processor cores (e.g., a multi-core). For example, the processor 1310 may include a dual-core, a quad-core, or a hexa-core. In addition, in FIG. 13, the computer system 1300 includes one processor 1310, but according to an exemplary embodiment of the inventive concept, the computer system 1300 may include a plurality of the processors 1310. In addition, according to an exemplary embodiment of the inventive concept, the processor 1310 may further include an internal or external cache memory.

The processor 1310 may include a memory controller 1311 for controlling operations of the memory module 1340. The memory controller 1311 included in the processor 1310 may be referred to as an integrated memory controller (IMC). A memory interface between the memory controller 1311 and the memory module 1340 may be realized in one channel including a plurality of signal lines, or in a plurality of channels. At least one memory module 1340 may be connected to each channel. According to an exemplary embodiment of the inventive concept, the memory controller 1311 may be disposed in the I/O hub 1320. The I/O hub 1320 including the memory controller 1311 may be referred to as a memory controller hub (MCH).

The memory module 1340 may include first memory chips arranged on a PCB, data buffers disposed on a first surface of the PCB and correspondingly connected to the first memory chips, and resistance units disposed on a second surface of the PCB, which is an opposite surface of the first surface, and correspondingly connected to the data buffers, for example. As another example, the memory module 1340 may include at least one memory chip arranged on a PCB, a data buffer disposed on a first surface of the PCB and having an output terminal connected to the memory chip, and a resistance unit disposed adjacent to a connecting terminal of a tab of the PCB, which is disposed on the second surface, having a first terminal connected to the connecting terminal, and having a second terminal connected to an input terminal of the data buffer through a first via hole penetrating through the PCB. The input terminal of the data buffer may be disposed adjacent to the memory chip and the output terminal of the data buffer may be disposed adjacent to the connecting terminal.

The I/O hub 1320 may manage data transmission between the processor 1310 and a device, such as the graphic card 1350. The I/O hub 1320 may be connected to the processor 1310 via an interface using any method. For example, the I/O hub 1320 and the processor 1310 may be connected to each other via an interface using any standard, such as a front side bus (FSB), a system bus, hypertransport, lighting data transport (LDT), quickpath interconnect (QPI), a common system interface, or a peripheral component interconnect-express (PCIe). In FIG. 13, the computer system 1300 includes one I/O hub 1320, but according to an embodiment, the computer system 1300 may include a plurality of the I/O hubs 1320.

The I/O hub 1320 may provide various interfaces with devices. For example, the I/O hub 1320 may provide an accelerated graphics port (AGP) interface, a PCIe interface, a communication streaming architecture (CSA) interface.

The graphic card 1350 may be connected to the I/O hub 1320 through AGP or PCIe. The graphic card 1350 may control a display device (not shown) for displaying an image. The graphic card 1350 may include an internal processor for processing image data, and an internal semiconductor memory device. According to an exemplary embodiment of the inventive concept, the I/O hub 1320 may include a graphic device therein together with the graphic card 1350 outside the I/O hub 1320 or instead of the graphic card 1350. The graphic device included in the I/O hub 1320 may be referred to as an integrated graphic device. In addition, the I/O hub 1320 including the memory controller 1311 and the graphic device may be referred to as a graphic and memory controller hub (GMCH).

The I/O controller hub 1330 may perform data buffering and interface arbitration such that various system interfaces operate efficiently. The I/O controller hub 1330 may be connected to the I/O hub 1320 through an internal bus. For example, the I/O hub 1320 and the I/O controller hub 1330 may be connected through a direct media interface (DMI), a hub interface, an enterprise southbridge interface (ESI), or a PCIe interface.

The I/O controller hub 1330 may provide various interfaces with peripheral devices. For example, the I/O controller hub 1330 may provide a USB port, a serial advanced technology attachment (SATA) port, a general purpose I/O (GPIO) port, a low pin count (LPC) bus, a serial peripheral interface (SPI) port, a PCI port, or a PCIe port.

According to an exemplary embodiment of the inventive concept, at least two of the processor 1310, the I/O hub 1320, and the I/O controller hub 1330 may be realized in one chipset.

The memory controller 1311 may be connected to the memory module 1340 through AGP or PCIe.

Figure 14:
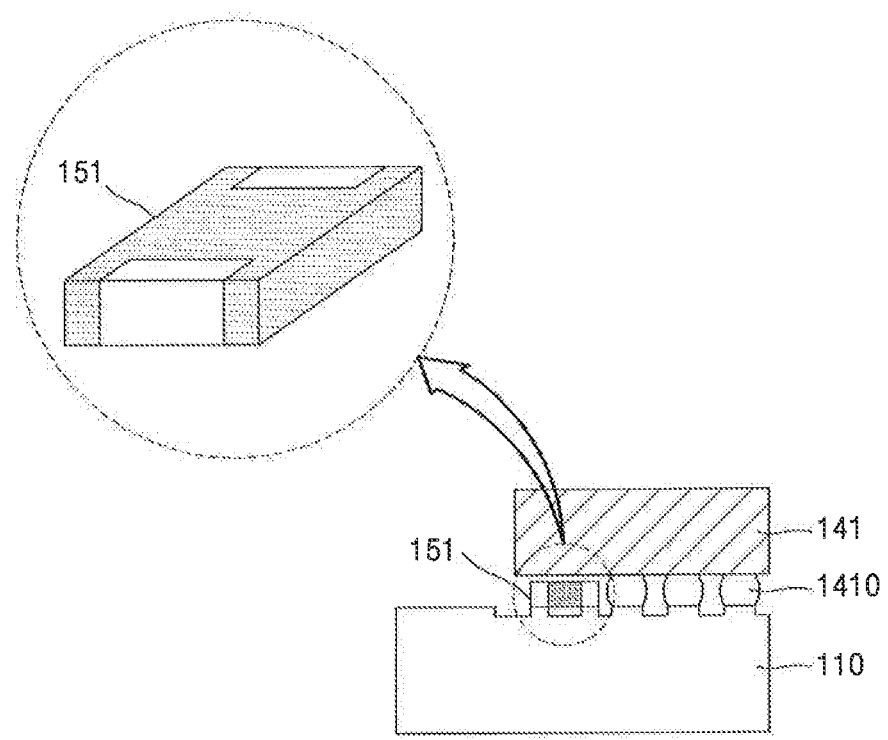
FIG. 14 is a block diagram illustrating a memory module according to an exemplary embodiment of the inventive concept.

FIG. 14 is a block diagram illustrating a memory module according to an exemplary embodiment of the inventive concept.

Referring to FIG. 14, a resistance unit 151 may be disposed under a data buffer 141. When the data buffer 141 is mounted on the printed circuit board 110 with a ball type connector 1410, there may be a gap between the bottom surface of the data buffer 141 and the surface of the printed circuit board 110. A resistance unit 151 which is thin enough to be fit into the gap may be disposed within the gap. The thickness of the resistance unit 151 may be less than 250 μm.

The one end of the resistance unit 151 may be connected to the data tab pin with a trace line on the printed circuit board 110, and the other end of the resistance unit 151 may be connected to the input terminal of the data buffer 141 with a trace line on the printed circuit board 110 and the ball type connector 141.

The output terminal of the data buffer 141 may be connected to memory chips through a ball type connector, a trace line on the printed circuit board and an internal layer of the printed circuit board 110. The internal layer may be disposed between the front surface of the printed circuit board 110 and the back surface of the printed circuit board and the internal layer may be disposed during fabrication of the printed circuit board 110.

The memory chips may be connected with the internal layer with a contact hole which is formed through the printed circuit board 110. The contact hole includes a conductive material to electrically connect the internal layer and the memory chips.

Figure 15:
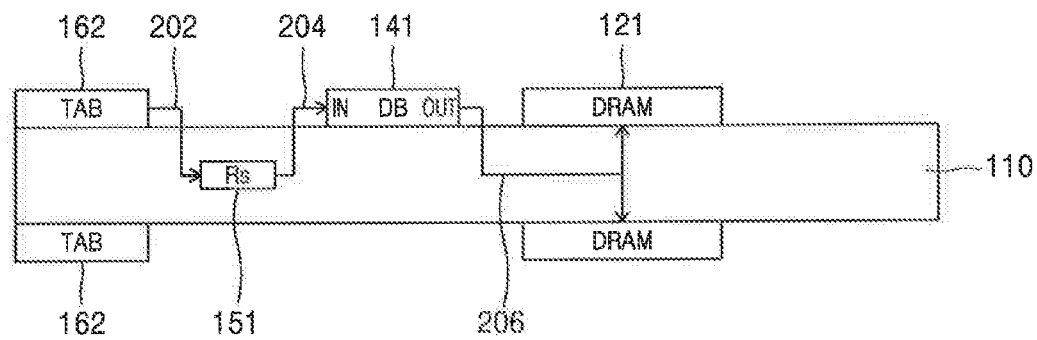
FIG. 15 is a block diagram illustrating a memory module according to an exemplary embodiment of the inventive concept.

FIG. 15 is a block diagram illustrating a memory module according to an exemplary embodiment of the inventive concept.

Referring to FIG. 15, a resistance unit 151 may be embedded within a printed circuit board 110. The resistance unit 151 may be formed with one of a resistance device, thin resistance film, metal plating and ceramic paste.

The resistance unit 151 may be formed by embedding a resistance device during fabrication of the printed circuit board 110. Alternatively, the resistance unit 151 may be embedded through a resistance forming process during fabrication of the printed circuit board 110. At least a portion of the resistance unit 151 may be disposed under a space between the first connecting terminal of the printed circuit board 110 and a first memory chip.

The following patent documents, which are hereby incorporated by reference in their entireties, describe configurations for the resistance unit, in which the resistance unit is embedded with a printed circuit board: U.S. Pat. Nos. 7,284,317; 5,510,594; 4,892,776; 8,559,235; and EP Pat. 569,801.

The one end of the resistance unit 151 may be connected to the data tab pin with a trace line on the printed circuit board 110 and a contact hole formed through the printed circuit board 110, and the other end of the resistance unit 151 may be connected to the input terminal of the data buffer 141 with a trace line on the printed circuit board 110, a contact hole formed through the printed circuit board 110 and a ball type connector.

The output terminal of the data buffer 141 may be connected to memory chips through a ball type connector, a trace line on the printed circuit board 110 and an internal layer of the printed circuit board 110. The internal layer may be disposed between the front surface of the printed circuit board 110 and the back surface of the printed circuit board 110 and the internal layer may be disposed during fabrication of the printed circuit board 110.

The memory chips may be connected with the internal layer with a contact hole which is formed through the printed circuit board 110. The contact hole includes a conductive material to electrically connect the internal layer and the memory chips.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A memory module, comprising:
    a printed circuit board having a first surface and a second surface, the second surface being opposite the first surface;
    a data tab pin formed on both surfaces of the printed circuit board for connecting the memory module with an external signal bus;

a first memory chip disposed on the first surface of the printed circuit board;

a second memory chip disposed on the second surface of the printed circuit board;

a data buffer disposed on the first surface of the printed circuit board, the data buffer including an input terminal and an output terminal, and the output terminal being connected to the first memory chip and the second memory chip respectively;

a resistance unit disposed on the first surface of the printed circuit board, the resistance unit having a first end and a second end for being connected to the data tab pin and the input terminal of the data buffer respectively;

a first wiring directly connecting the data tab pin and the first end of the resistance unit;

a second wiring directly connecting the second end of the resistance unit to the input terminal of the data buffer; and third wiring directly connecting the output terminal of the data buffer to the first memory chip and the second memory chip, wherein at least a portion of the resistance unit is disposed directly under the data buffer, wherein the data buffer is disposed between the data tab pin on the first surface of the printed circuit board and the first memory chip, and the resistance unit is disposed between the data tab pin on the first surface of the printed circuit board and the first memory chip.

2. The memory module of claim 1, wherein at least a portion of the third wiring is formed within an internal layer of the printed circuit board, and is connected to the first memory chip and the second memory chip through a via penetrating the printed circuit board.

3. The memory module of claim 1, wherein the first memory chip and the second memory chip are connected to each other through a via penetrating the printed circuit board.

4. The memory module of claim 1, wherein the memory module further includes a plurality of third memory chips, second data buffers and second resistance units arranged in parallel on the first surface of the printed circuit board, and a plurality of fourth memory chips.

5. The memory module of claim 4, wherein the second data buffers and second resistance units are disposed between the data tab pin and the third memory chips.

6. The memory module of claim 4, wherein the memory module further includes a plurality of fifth memory chips arranged in parallel with the second data buffers, the second resistance units and the third memory chips.

7. The memory module of claim 6, wherein the second data buffers and the second resistance units are placed between the third memory chips and the fifth memory chips on the first surface of the printed circuit hoard.

8. The memory module of claim 1, wherein the data buffer is mounted on the first surface of the printed circuit board through a ball type connector, and the height of the ball type connector is taller than the thickness of the resistance unit.

9. The memory module of claim 8, wherein top surface of the resistance unit is lower than the bottom surface of the data buffer.

10. A memory module, comprising:

a printed circuit board having a first surface and a second surface, the second surface being opposite the first surface;

a data tab pin formed on both surfaces of the printed circuit board for connecting the memory module with an external signal bus;

a first memory chip disposed on the first surface of the printed circuit board;

a second memory chip disposed on the second surface of the printed circuit board;

a data buffer disposed on the first surface of the printed circuit board, the data buffer including an input terminal and an output terminal, and the output terminal being connected to the first memory chip and the second memory chip respectively;

a resistance unit embedded in the printed circuit board, the resistance unit having a first end and a second end for being connected to the data tab pin and the input terminal of the data buffer through contact holes formed on the printed circuit board respectively;

a first wiring directly connected to the data tab pin and a first end of the resistance unit;

a second wiring directly connecting the second end of the resistance unit to the input terminal of the data buffer; and a third wiring directly connecting the output terminal of the data buffer to the first memory chip and the second memory chip, wherein the resistance unit is disposed between the first surface of the printed circuit board and the second surface of the printed circuit board, wherein the data buffer is disposed between the first connecting terminal on the first surface of the printed circuit board and the first memory chip.

11. The memory module of claim 10, wherein at least a portion of the third wiring is formed within an internal layer of the printed circuit board, and is connected to the first memory chip and the second memory chip through a via penetrating the printed circuit board.

12. The memory module of claim 10, wherein the resistance unit is formed with one of a resistance device, thin resistance film, metal plating and ceramic paste.

13. The memory module of claim 12, wherein the resistance unit is formed by embedding a resistance device during fabrication of the printed circuit board.

14. The memory module of claim 12, wherein the resistance unit is embedded through a resistance forming process during fabrication of the printed circuit board.

15. The memory module of claim 10, wherein at least portion of the resistance unit is disposed under a space between the first connecting terminal of the printed circuit board and the first memory chip.

16. The memory module of claim 10, wherein the first memory chip and the second memory chip are connected to each other through a via penetrating the printed circuit board.

17. The memory module of claim 10, wherein the memory module further includes a plurality of third memory chips and second data buffers arranged in parallel on the first surface of the printed circuit board.

18. The memory module of claim 17, wherein the second data buffers are arranged between the first connecting terminal and the third memory chips on the first surface of the printed circuit board.

* * * * *